US012603636B2

(12) United States Patent
Goto et al.

(10) Patent No.: US 12,603,636 B2
(45) Date of Patent: *Apr. 14, 2026

(54) PACKAGED ACOUSTIC WAVE DEVICES WITH MULTI-LAYER PIEZOELECTRIC SUBSTRATE

(71) Applicant: Skyworks Solutions, Inc., Irvine, CA (US)

(72) Inventors: Rei Goto, Osaka (JP); Hironori Fukuhara, Ibaraki (JP); Takuya Ushiyama, Moriguchi (JP)

(73) Assignee: Skyworks Solutions, Inc., Irvine, CA (US)

( * ) Notice: Subject to any disclaimer, the term of this patent is extended or adjusted under 35 U.S.C. 154(b) by 1066 days.

This patent is subject to a terminal disclaimer.

(21) Appl. No.: 17/454,969

(22) Filed: Nov. 15, 2021

(65) Prior Publication Data

US 2022/0158612 A1 May 19, 2022

Related U.S. Application Data

(60) Provisional application No. 63/115,830, filed on Nov. 19, 2020, provisional application No. 63/115,828, filed on Nov. 19, 2020.

(51) Int. Cl.

| | |
|---|---|
| *H03H 9/08* | (2006.01) |
| *H03H 3/00* | (2006.01) |
| *H03H 3/007* | (2006.01) |
| *H03H 3/08* | (2006.01) |
| *H03H 9/02* | (2006.01) |
| *H03H 9/05* | (2006.01) |

(Continued)

(52) U.S. Cl.
CPC ............... *H03H 9/08* (2013.01); *H03H 3/00* (2013.01); *H03H 3/007* (2013.01); *H03H 3/08* (2013.01); *H03H 9/02574* (2013.01); *H03H 9/0561* (2013.01); *H03H 9/1064* (2013.01); *H03H 9/25* (2013.01); *H03H 9/0576* (2013.01)

(58) Field of Classification Search
CPC ............ H03H 9/0547; H03H 9/02834; H03H 9/0576; H03H 9/25; H03H 9/1064; H03H 9/0561; H03H 9/02574; H03H 9/08
See application file for complete search history.

(56) References Cited

U.S. PATENT DOCUMENTS

| | | |
|---|---|---|
| 8,294,535 B2 | 10/2012 | Feiertag et al. |
| 8,723,621 B2 * | 5/2014 | Kidoh .................... H03H 9/725 |
| | | 333/133 |

(Continued)

*Primary Examiner* — J. San Martin
(74) *Attorney, Agent, or Firm* — Knobbe, Martens, Olson & Bear, LLP

(57) ABSTRACT

Aspects of this disclosure relate to a packaged acoustic wave component with two acoustic wave devices interconnected by a thermally conductive frame, at least one of the acoustic wave devices including a multi-layer piezoelectric substrate. The multi-layer piezoelectric substrate includes a support layer and a piezoelectric layer disposed over the support layer. An interdigital transducer (IDT) electrode is disposed over the piezoelectric layer. The support layer has a high thermal conductivity, allowing heat generated by a first acoustic wave device with the multi-layer piezoelectric substrate to be transferred to a second acoustic wave device on which it is stacked to dissipate heat from the first acoustic wave device by way of the thermally conductive frame.

23 Claims, 12 Drawing Sheets

(51) Int. Cl.
    *H03H 9/10*         (2006.01)
    *H03H 9/25*         (2006.01)

(56)            References Cited

U.S. PATENT DOCUMENTS

| | | | |
|---|---|---|---|
| 9,634,641 B2 | 4/2017 | Nishimura et al. | |
| 10,873,311 B2 | 12/2020 | Ando et al. | |
| 11,133,789 B2 | 9/2021 | Maki et al. | |
| 11,368,137 B2 | 6/2022 | Goto et al. | |
| 11,463,065 B2 | 10/2022 | Goto | |
| 11,552,614 B2 | 1/2023 | Caron et al. | |
| 11,588,465 B2 * | 2/2023 | Fukuhara | H03H 9/6406 |
| 11,616,487 B2 | 3/2023 | Nakamura et al. | |
| 11,705,883 B2 | 7/2023 | Hiramatsu et al. | |
| 11,722,122 B2 | 8/2023 | Goto et al. | |
| 11,750,172 B2 | 9/2023 | Goto et al. | |
| 11,881,837 B2 | 1/2024 | Caron et al. | |
| 11,923,822 B2 | 3/2024 | Maki et al. | |
| 12,244,297 B2 | 3/2025 | Komatsu et al. | |
| 12,273,090 B2 | 4/2025 | Wang et al. | |
| 2006/0012021 A1 | 1/2006 | Larson, III et al. | |
| 2013/0313947 A1 | 11/2013 | Chen et al. | |
| 2017/0250669 A1 * | 8/2017 | Kuroyanagi | H03H 9/02574 |
| 2017/0288629 A1 * | 10/2017 | Bhattacharjee | H03H 9/02275 |
| 2020/0067482 A1 * | 2/2020 | Maki | H03H 9/02834 |
| 2021/0099157 A1 | 4/2021 | Takano et al. | |
| 2022/0158610 A1 | 5/2022 | Goto et al. | |
| 2022/0329227 A1 * | 10/2022 | Goto | H03H 9/0547 |
| 2023/0111476 A1 | 4/2023 | Fukuhara et al. | |
| 2023/0111849 A1 | 4/2023 | Maki et al. | |
| 2023/0120844 A1 | 4/2023 | Goto et al. | |

* cited by examiner 200,200'

200,200'

1

PACKAGED ACOUSTIC WAVE DEVICES WITH MULTI-LAYER PIEZOELECTRIC SUBSTRATE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

Reduction in the size of an acoustic wave filter can be achieved by using stacked SAW packages (e.g., temperature compensated surface acoustic wave (TCSAW) filters) having stacked wafers. However, such structures have power durability limitations due to lower thermal dissipation on the upper wafer.

SUMMARY

Accordingly, there is a need for a surface acoustic wave (e.g., SAW or TCSAW) package with improved thermal dissipation performance, resulting in higher power durability performance.

In accordance with one aspect of the disclosure, a packaged acoustic wave component is provided. The packaged acoustic wave component comprises a first acoustic wave device including a first multi-layer piezoelectric substrate and a first interdigital transducer electrode. The first multi-layer piezoelectric substrate includes a first piezoelectric layer and support layer, the support layer having a higher thermal conductivity than the first piezoelectric layer. The packaged acoustic wave component also comprises a second acoustic wave device including a second piezoelectric layer and second interdigital transducer electrode. The first acoustic wave device is stacked with the second acoustic wave device so that the first and second interdigital transducer electrodes face and are spaced apart from each other. The packaged acoustic wave component also comprises a thermally conductive frame interposed between the first and second acoustic wave devices. The first multi-layer piezoelectric substrate is configured to direct heat generated by the first acoustic wave device to the second acoustic wave device by way of the thermally conductive frame to dissipate heat from the first acoustic wave device.

In accordance with another aspect of the disclosure, a packaged acoustic wave component is provided. The packaged acoustic wave component comprises a first acoustic wave device including a first multi-layer piezoelectric substrate having a first piezoelectric layer disposed over a first support layer, and having a first interdigital transducer electrode. The packaged acoustic wave component also comprises a second acoustic wave device including a second piezoelectric layer and second interdigital transducer electrode. The first acoustic wave device is stacked with the second acoustic wave device so that the first and second interdigital transducer electrodes face and are spaced apart from each other. The packaged acoustic wave component also comprises a thermally conductive frame interposed between the first and second acoustic wave devices and in contact with the first support layer. The first multi-layer piezoelectric substrate is configured to direct heat generated by the first acoustic wave device to the second acoustic wave device by way of the thermally conductive frame to dissipate heat from the first acoustic wave device.

In accordance with another aspect of the disclosure, a radio frequency module is provided. The radio frequency module comprises a package substrate and a package acoustic wave component. The package acoustic wave component includes a first acoustic wave device including a first multi-layer piezoelectric substrate with a first piezoelectric layer disposed over a first support layer and a first interdigital transducer electrode. The package acoustic wave component also comprises a second acoustic wave device including a second piezoelectric layer and second interdigital transducer electrode. The first acoustic wave device is stacked with the second acoustic wave device so that the first and second interdigital transducer electrodes face and are spaced apart from each other. A thermally conductive frame is interposed between the first and second acoustic wave devices, the first multi-layer piezoelectric substrate being configured to direct heat generated by the first acoustic wave device to the second acoustic wave device by way of the thermally conductive frame to dissipate heat from the first acoustic wave device. The radio frequency module further comprises additional circuitry, the packaged acoustic wave component and additional circuitry disposed on the package substrate.

In accordance with another aspect of the disclosure, a wireless communication device is provided. The wireless communication device comprises an antenna and a front end module including one or more packaged acoustic wave components configured to filter a radio frequency signal associated with the antenna. Each surface acoustic wave component includes a first acoustic wave device including a first multi-layer piezoelectric substrate with a first piezoelectric layer disposed over a first support layer and a first interdigital transducer electrode. Each surface acoustic wave component also includes a second acoustic wave device with a second piezoelectric layer and second interdigital transducer electrode. The first acoustic wave device is stacked with the second acoustic wave device so that the first and second interdigital transducer electrodes face and are spaced apart from each other. A thermally conductive frame is interposed between the first and second acoustic wave devices, the first multi-layer piezoelectric substrate being configured to direct heat generated by the first acoustic wave device to the second acoustic wave device by way of the thermally conductive frame to dissipate heat from the first acoustic wave device.

In accordance with another aspect of the disclosure, a method of manufacturing a packaged acoustic wave component is provided. The method comprises providing a first acoustic wave device including a multi-layer piezoelectric substrate structure with a first piezoelectric layer disposed over a first support layer and an interdigital transducer electrode. The method also comprises stacking the first acoustic wave device relative to a second acoustic wave device such that a thermally conductive frame extends between the first acoustic wave device and the second acoustic wave device, the thermally conductive frame providing a thermal path for heat dissipation from the first acoustic wave device to the second acoustic wave device.

In accordance with another aspect of the disclosure, a method of dissipating heat for packaged acoustic wave component is provided. The method comprises generating an acoustic wave using a first acoustic wave device that includes a multi-layer piezoelectric substrate structure with a first piezoelectric layer disposed over a first support layer and a first interdigital transducer electrode. The method also comprises dissipating heat associated with the first acoustic wave device using a thermal path that includes a thermally conductive frame extending from the first acoustic wave device to a second acoustic wave device, the first acoustic wave device being stacked relative to the second acoustic wave device, and the second acoustic wave device having a second interdigital transducer electrode that faces and is spaced apart from the first interdigital transducer electrode.

BRIEF DESCRIPTION OF THE DRAWINGS

Embodiments of this disclosure will now be described, by way of non-limiting example, with reference to the accompanying drawings.

DETAILED DESCRIPTION

Figure 1:
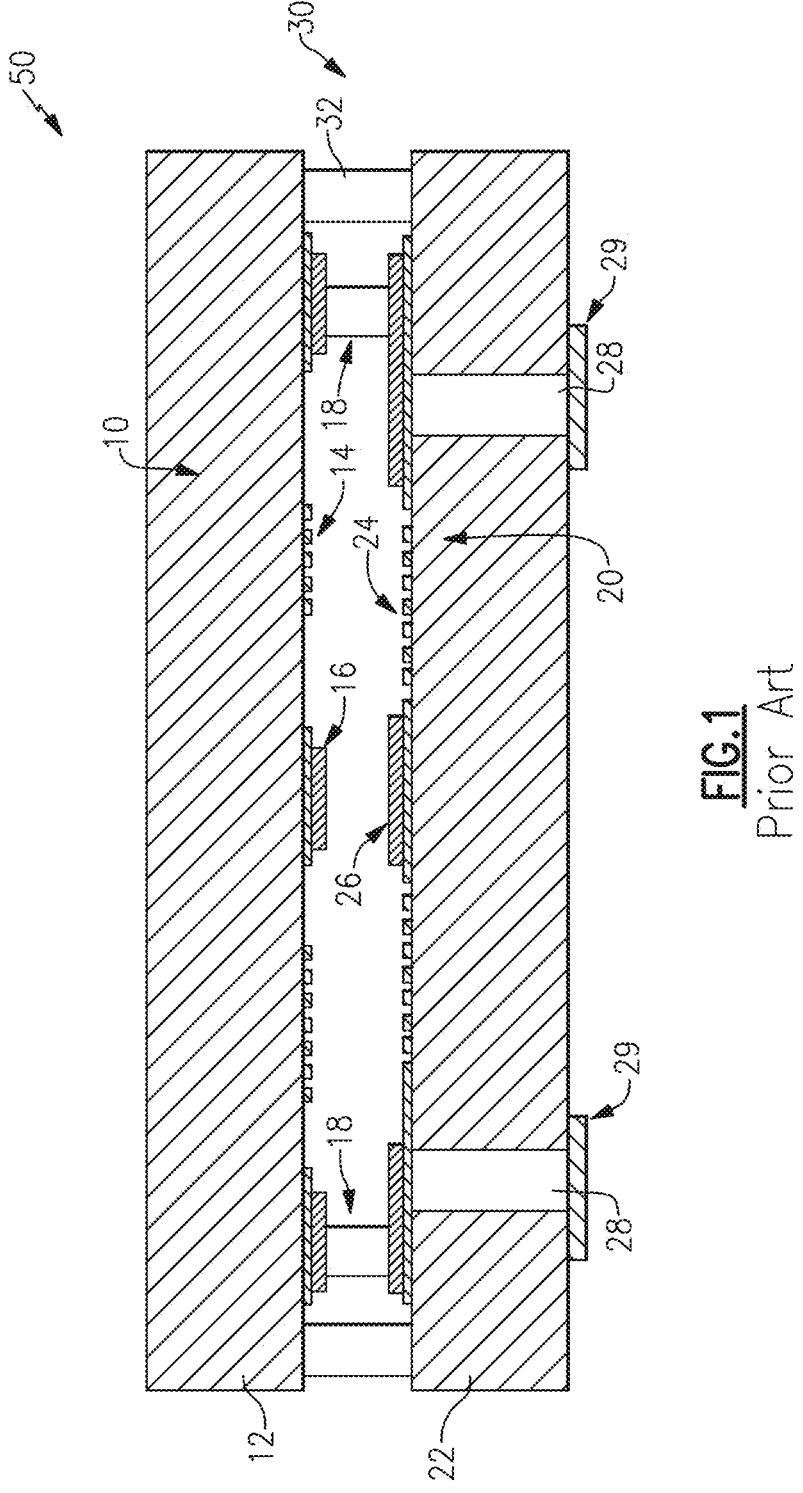
FIG. 1 illustrates a schematic cross-sectional side view of a conventional stacked surface acoustic wave device structure.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters). Any features of the SAW resonators and/or devices discussed herein can be implemented in any suitable SAW device.

In general, high quality factor (Q), large effective electromechanical coupling coefficient ($k^2$), high frequency ability, and spurious free response can be significant aspects for acoustic wave elements to enable low-loss filters, delay lines, stable oscillators, and sensitive sensors.

Multi-layer piezoelectric substrate (MPS) SAW resonators can thermally insulate an interdigital transducer electrode and a piezoelectric layer. By reducing dissipative thermal impedance of the SAW device, the ruggedness and power handling can be improved.

Some MPS SAW resonators have achieved high Q by confining energy and good thermal dissipation using a silicon (Si) support layer. However, such approaches have encountered technical challenges related to undesirable higher frequency spurious responses.

Some other MPS SAW resonators have achieved high Q by confining energy and have also reduced higher frequency spurious responses. However, such approaches have encountered relatively low thermal heat dissipation.

Aspects of the present disclosure relate to SAW resonators that include a support substrate or layer (e.g., a single crystal supporting substrate), a functional layer (e.g., a dielectric layer) over the support substrate or layer, a piezoelectric layer (e.g., a lithium niobate (LN) layer or a lithium tantalate (LT) layer) over the functional layer, and an interdigital transducer (IDT) electrode over the piezoelectric layer. Such SAW resonators can also include a temperature compensation layer (e.g., silicon dioxide (SiO2) layer) over the IDT electrode in certain embodiments. The SAW resonators can also include an adhesion layer disposed between the support substrate and the functional layer and/or an adhesion layer between the functional layer and the piezoelectric layer, in certain applications.

SAW resonators with the functional layer and the support layer or substrate can beneficially provide a relatively high effective electromechanical coupling coefficient ($k^2$), a relatively high quality factor (Q), a relatively high power durability and thermal dissipation, and reduced high frequency spurious responses. The high coupling coefficient ($k^2$) can be beneficial for relatively wide bandwidth filters. The high quality factor (Q) can beneficially lead to a relatively low insertion loss. The reduced high frequency spurious may make the SAW resonators compatible with multiplexing with higher frequency bands.

In an embodiment, an MPS SAW resonator includes a piezoelectric layer over a functional layer over a silicon support substrate or layer. The silicon support substrate can reduce thermal impedance of the MPS SAW resonator. The functional layer can be a single crystal layer arranged to confine acoustic energy and lower a higher frequency spurious response. The piezoelectric layer, the functional layer, and the silicon support substrate can all be single crystal layers.

Embodiments of MPS SAW resonators will now be discussed. Any suitable principles and advantages of these MPS SAW resonators can be implemented together with each other in an MPS SAW resonator and/or in an acoustic wave filter. MPS SAW resonators disclosed herein can have lower loss than certain bulk acoustic wave devices.

Figure 2:
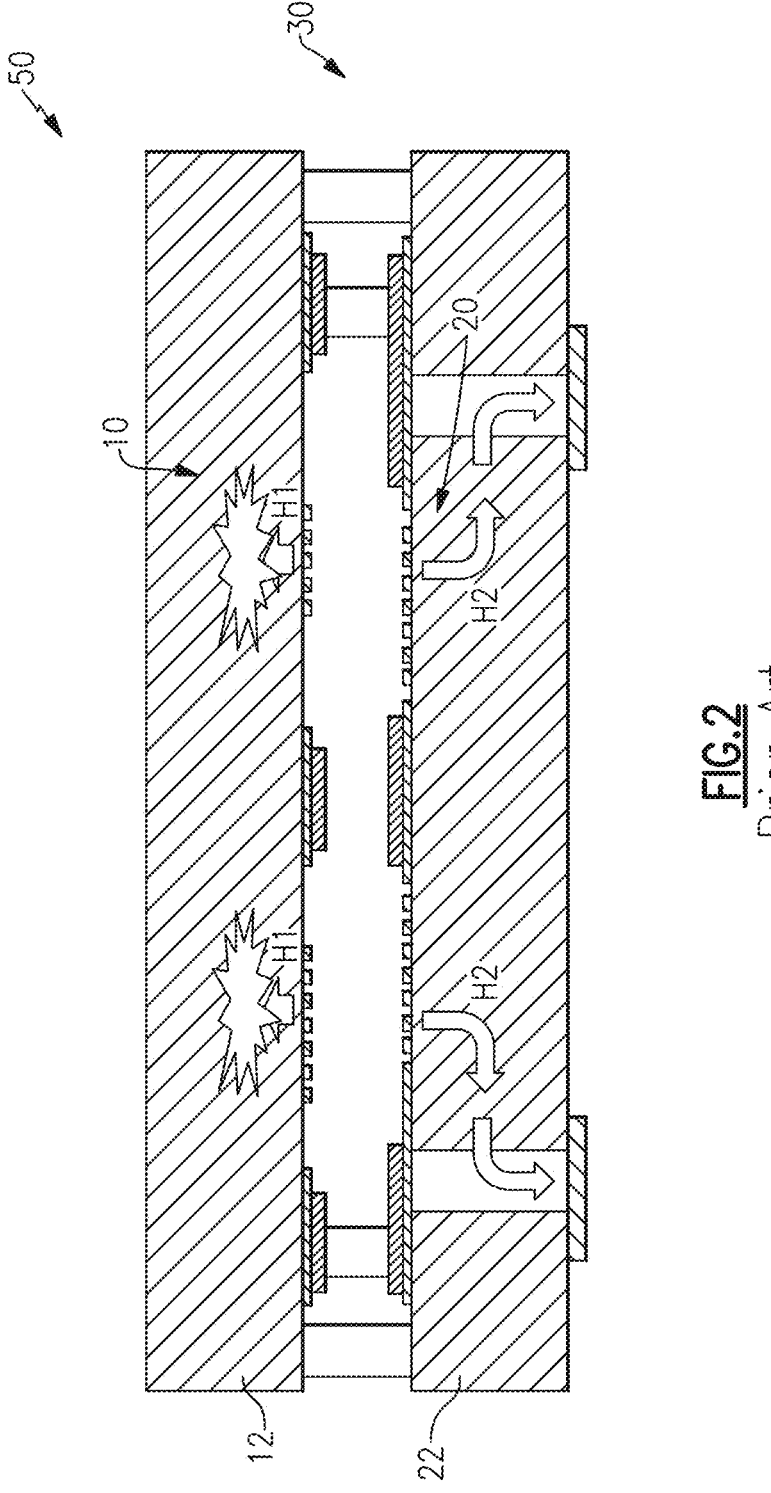
FIG. 2 illustrates a schematic side view of heat flow in the stacked surface acoustic wave device structure of FIG. 1.

FIGS. 1-2 illustrate a conventional surface acoustic wave (SAW) package or stacked surface acoustic wave device structure 50 with a first surface acoustic wave (SAW) resonator or device 10 and a second SAW resonator or device 20, the first SAW device 10 supported by a frame 30 on the second SAW device 20. The first and second SAW resonators or devices 10, 20 each have a piezoelectric substrate 12, 22 and an interdigital transducer (IDT) electrode 14, 24 disposed on the piezoelectric substrate 12. The piezoelectric substrate 12, 22 is made of lithium tantalite (LT) or lithium niobite (LN). Vias 18 extend between metal layers 16, 26 attached to the IDT electrodes 14, 24 of the first and second SAW resonators or devices 10, 20. The second SAW resonator 20 has vias 28 that extend through the piezoelectric substrate 22 from the IDT electrode 24 to electrodes 29 on an opposite side of the piezoelectric substrate 22 from the IDT electrode 24.

As shown in FIG. 2, heat generated by the IDT electrode 14 of the first SAW resonator or device 10, shown by arrows H1, is trapped in the piezoelectric substrate 12 (e.g., due to LN and LT having a poor thermal conductivity), causing the temperature of the piezoelectric substrate 12 and first SAW resonator 10 to increase. Testing of the SAW package 50 has found that temperature of the first SAW resonator or device 10 (e.g., temperature of at least a portion of the piezoelectric substrate 12) increases to approximately 150 degrees Celsius. Such temperature performance is undesirable because the first SAW resonator or device 10 (e.g., the piezoelectric substrate 12 of the first SAW resonator or device 10) can crack or break at temperatures above 100 degrees Celsius. Such temperature performance also prevents the use of the first SAW resonator or device 10 for high power applications (e.g., in a high power transmit filter). Heat generated by the IDT electrode 24 of the second SAW resonator or device 10, shown by arrows H2, is dissipated from the piezoelectric substrate 22 by the vias 28, which transfer said heat to the electrodes 29 and to a printed circuit board (PCB) on which the SAW package or stacked surface acoustic wave device structure 50 is mounted. Therefore, the SAW package or stacked surface acoustic wave device structure 50 has power durability limitations due to the high temperatures the first SAW resonator or device 10 experiences.

Figure 3:
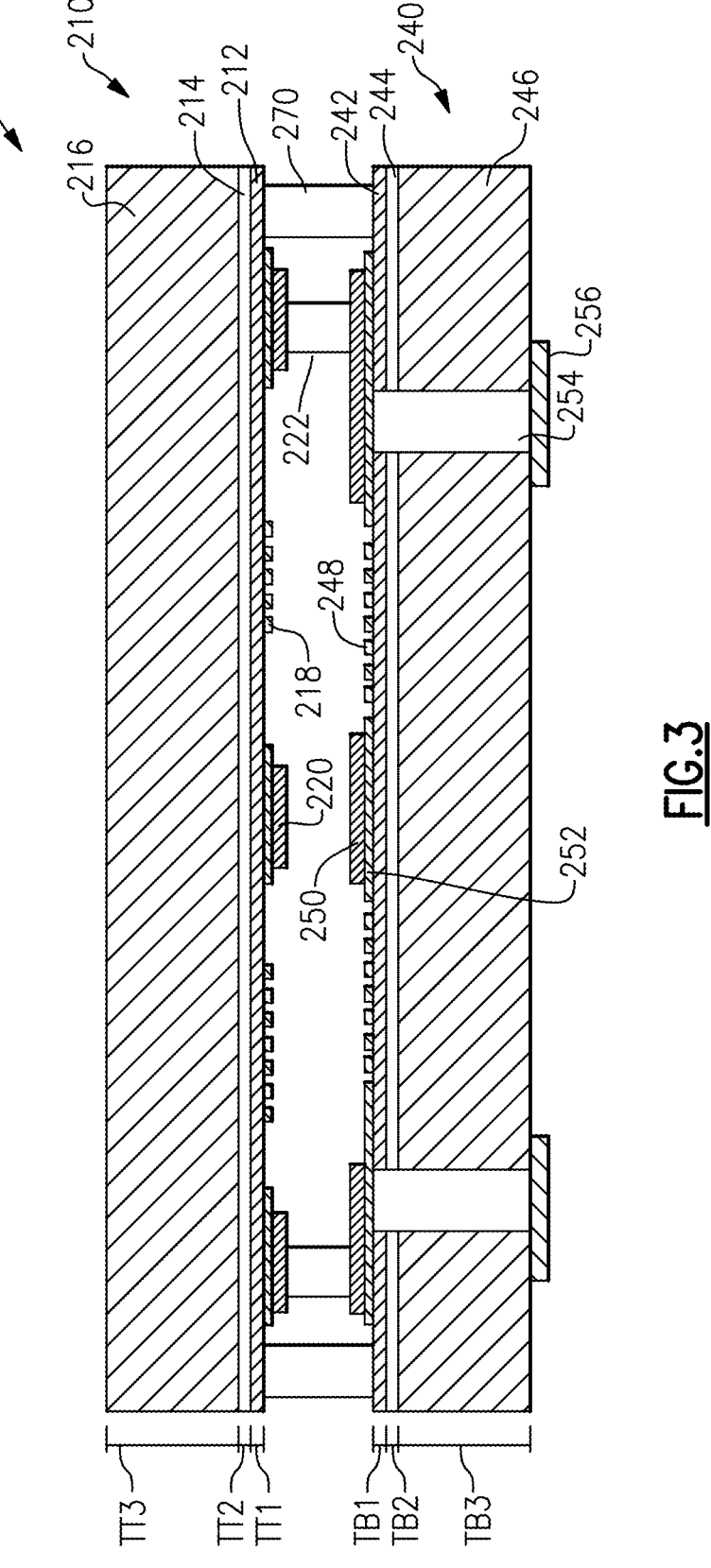
FIG. 3 illustrates a schematic cross-sectional side view of a stacked Multi-layer piezoelectric substrate (MPS) structure.
Figure 4:
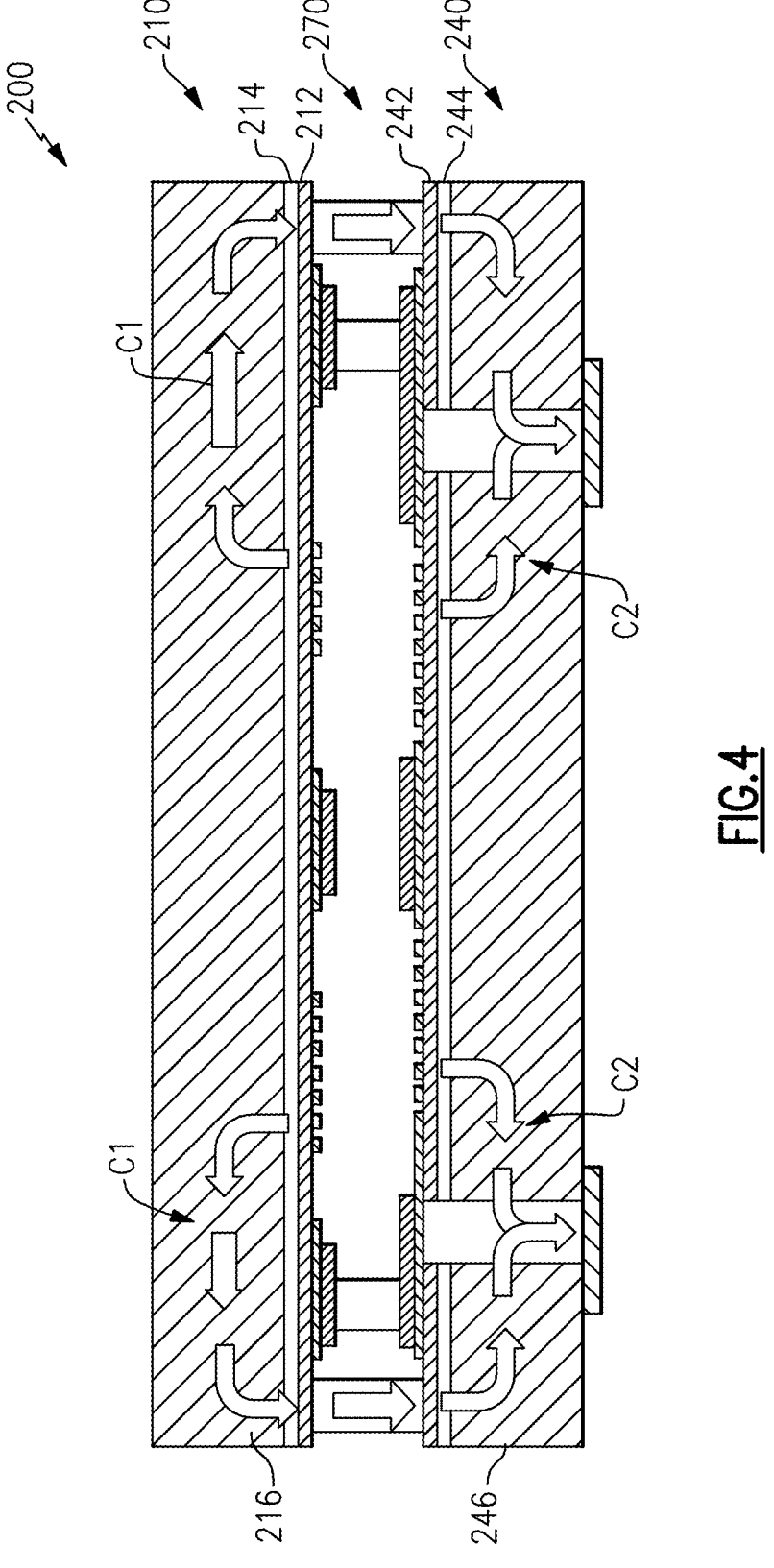
FIG. 4 illustrates a schematic side view of heat flow in the stacked MPS structure of FIG. 3.

FIGS. 3-4 illustrate a packaged acoustic wave component 200 with a first (top or upper) acoustic wave resonator or device or die 210 and a second (bottom or lower) acoustic wave resonator or device or die 240. The first and second acoustic wave resonators or devices or dies 210, 240 generate a surface acoustic wave having a wavelength λ or L.

The first acoustic device 210 is supported by a frame 270 on the second acoustic wave device 240. The first and second acoustic wave resonators or devices or dies 210, 240 each have support layer or substrate 216, 246, a functional layer 214, 244 disposed over the support layer 216, 246, a piezoelectric layer 212, 242 disposed over the functional layer 214, 244, and an interdigital transducer (IDT) electrode 218, 248 disposed on the piezoelectric layer 212, 242. In some implementations, the functional layer 214, 244 is excluded. The first and second acoustic wave resonators or devices or dies 210, 240 therefore have a multi-layer piezoelectric substrate (MPS) (e.g., are MPS dies). In one implementation, only the first acoustic wave device 210 has a multi-layer piezoelectric substrate (MPS) and the second acoustic wave device 240 has a piezoelectric layer 242 (e.g., but does not have a multi-layer piezoelectric substrate). Vias 222 extend between metal layers 220, 250 attached to the IDT electrodes 218, 248 of the first and second acoustic wave resonators or devices or dies 210, 240. The second acoustic wave device 240 has vias 254 that extend from the IDT electrode 248 to electrodes 256 on an opposite side of the support layer 246 from the IDT electrode 248. The second acoustic wave device 240 is spaced apart from and inverted relative to the first acoustic wave device 210 so that the second interdigital transducer electrode 248 is spaced apart from (e.g., spaced below) and faces the first interdigital transducer electrode 218.

In one implementation, the first and second acoustic wave devices 210, 240 can have the same materials and dimensions. In another implementation, the first and second acoustic wave devices 210, 240 can have different materials and/or dimensions. In one example, as shown in FIGS. 3-4, the functional layer 214, 244 is coextensive (e.g., extends across the same area, extends along the same length) with the support layer or substrate 216, 246. In one example, as shown in FIGS. 3-4, the piezoelectric layer 212, 242 is coextensive (e.g., extends across the same area, extends along the same length) with the functional layer 214, 244. In another implementation, as discussed further below, one or both of the functional layer 214, 244 and piezoelectric layer 212, 242 is not coextensive with (e.g., extends across a smaller area, extends along a shorter length than) the support layer or substrate 216, 246.

With respect to the first acoustic wave device 210, the piezoelectric layer 212 can have a thickness TT1, the functional layer 214 can have a thickness TT2 and the support layer or substrate 216 can have a thickness TT3. The thickness TT3 of the support layer 216 is greater than the thickness TT1, TT2 of the piezoelectric layer 212 and the functional layer 214. Optionally, the thickness TT1 of the piezoelectric layer 212 is substantially equal to the thickness TT2 of the functional layer 214.

With respect to the second acoustic wave device 240, the piezoelectric layer 242 can have a thickness TB1, the functional layer 244 can have a thickness TB2 and the support layer or substrate 246 can have a thickness TB3. The thickness TB3 of the support layer 246 is greater than the thickness TB1, TB2 of the piezoelectric layer 242 and the functional layer 244. Optionally, the thickness TB1 of the piezoelectric layer 242 is substantially equal to the thickness TB2 of the functional layer 244.

In one implementation the thickness TT3, TB3 of the support layers 216, 246 are substantially the same. In one implementation the thickness TT2, TB2 of the functional layers 214, 244 are substantially the same. In one implementation the thickness TT1, TB1 of the piezoelectric layers 212, 242 are substantially the same.

The support layers or substrates 216, 246 of the first and second acoustic wave resonators or devices or dies 210, 240 are made of a material with high thermal conductivity. In one example, the support layers 216, 246 are made of silicon. In another example, the support layers 216, 246 are made of aluminum nitride (AlN). In another example, the support layers 216, 246 are made of sapphire. In another example, the support layers 216, 246 are made of quartz. The support layers 216, 246 have a higher thermal conductivity than the material of the piezoelectric layers 212, 242.

In one example, the functional layers 214, 244 are temperature compensation layers. In another example, the functional layers 214, 244 are dielectric layers.

The frame 270 can be made of a thermally conductive material. In one example, the frame 270 can be made of a metal, such as copper, tin, gold, etc. Other suitable thermally conductive materials (metal and non-metal) can also be used for the frame 270. The frame 270, when made of metal, can be connected to a ground of the packaged acoustic wave component 200.

The frame 270 can in one implementation extend along the periphery of the first and second acoustic wave resonators or devices or dies 210, 240 to seal or encapsulate the air cavity between the first and second acoustic wave resonators or devices or dies 210, 240. As shown in FIG. 3, the frame 270 extends between (e.g., is in thermal communication with, in thermal contact with, in direct contact with) and interconnects the first and second acoustic wave devices 210, 240 (e.g., interconnects the piezoelectric layers 212, 242 of the first and second acoustic wave devices 210, 240). The frame 270 supports the first acoustic wave device 210 on the second acoustic wave device 240. The frame 270 thermally communicates the first acoustic wave device 210 with the second acoustic wave device 240. In one example, a width of the frame 270 can be increased, which can increase the amount of heat the frame 270 transfers from the first acoustic wave device 210 to the second acoustic wave device 240. Additionally, the vias 222 can thermally communicate the first acoustic wave device 210 with the second acoustic wave device 240.

The first acoustic wave device 210 and second acoustic wave device 240 can electrically communicate via the vias 222. Said electrical communication can be directed to electrodes 256 via the vias 254, and onto a printed circuit board (PCB) on which the packaged acoustic wave component 200 is mounted.

As shown in FIG. 4, heat generated by the IDT electrode 218 of the first acoustic wave resonator or device or die 210 is directed to the frame 270, as shown by arrows C1, to transfer said heat to the second acoustic wave resonator or device or die 240. Such heat transfer to the frame 270 is facilitated by the high thermal conductivity of the support layer or substrate 216 of the first acoustic wave device 210. Additionally, though not shown, heat from the first acoustic wave device 210 can also be transferred by the vias 222 to the second acoustic wave device 240. Heat generated by the IDT electrode 248 of the second acoustic wave device 240 and heat received from the first acoustic wave device 210 (e.g., via the frame 270), shown by arrows C2, is dissipated from the second acoustic wave device 240 by the vias 254, which transfer said heat to the electrodes 256 and to the printed circuit board (PCB) on which the packaged acoustic wave component 200 is mounted.

Figure 5:
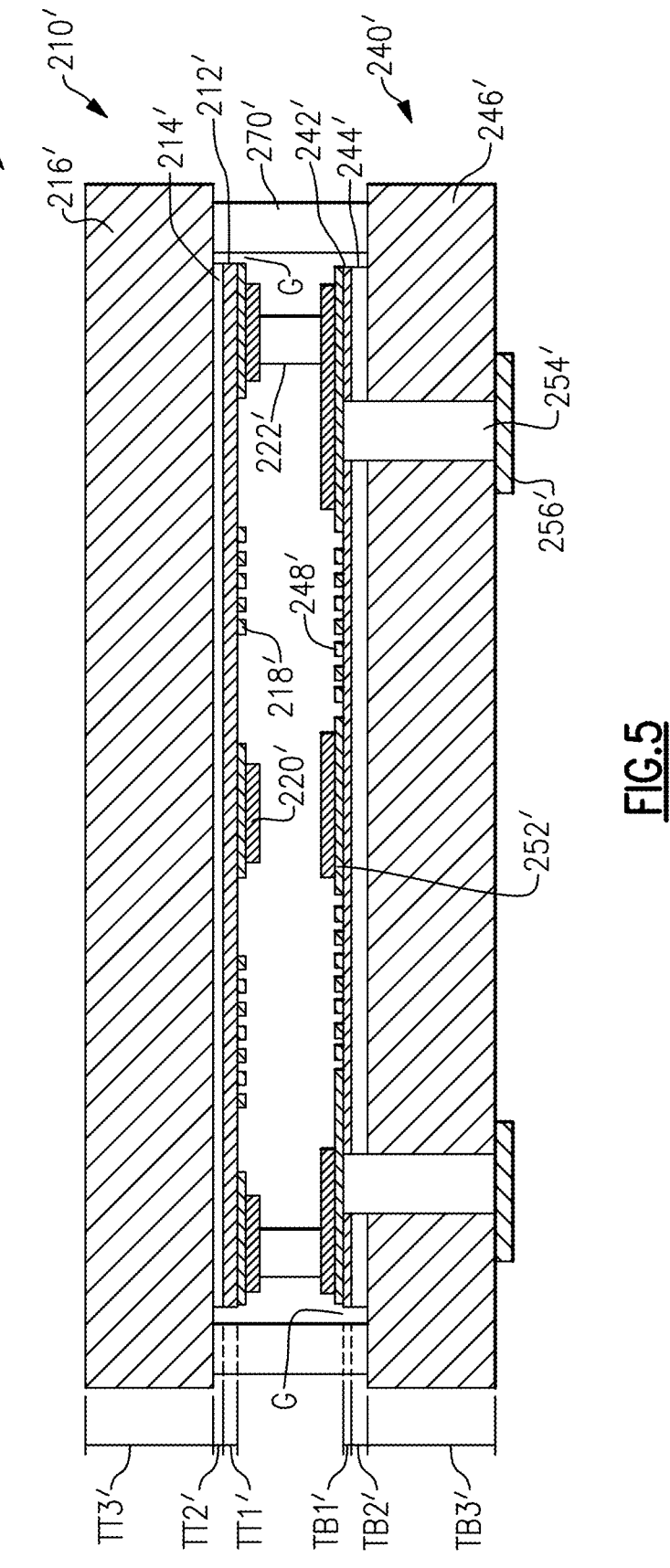
FIG. 5 illustrates a schematic cross-sectional side view of a stacked Multi-layer piezoelectric substrate (MPS) structure.
Figure 6:
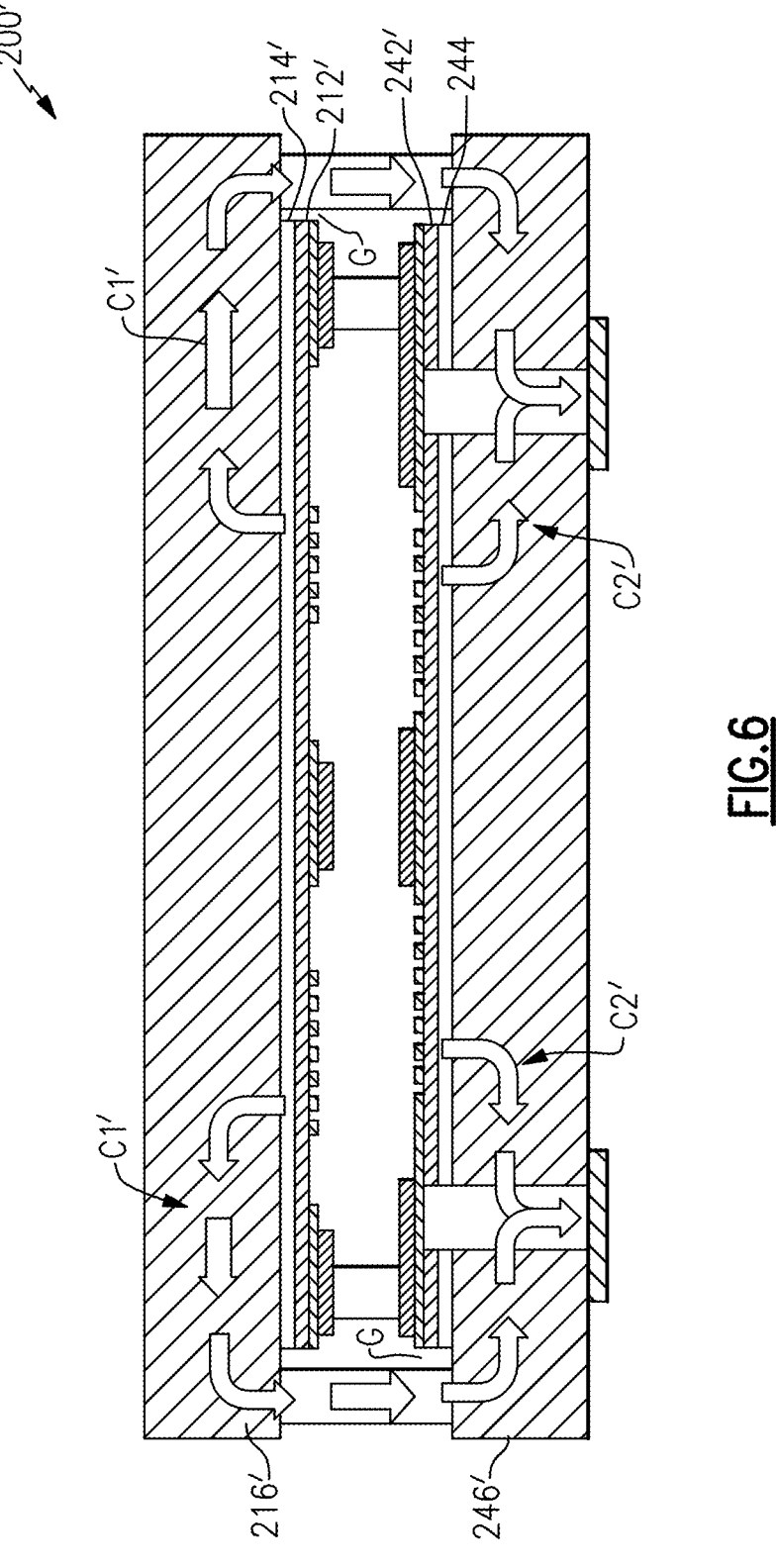
FIG. 6 illustrates a schematic side view of heat flow in the stacked MPS structure of FIG. 5.

FIGS. 5-6 shows another embodiment of a packaged acoustic wave component 200'. Some of the features of the packaged acoustic wave component 200' are similar to features of the package acoustic wave component 200 in FIGS. 3-4. Thus, references numerals used to designate the various components of the packaged acoustic wave component 200' are identical to those used for identifying the corresponding components of the packaged acoustic wave component 200 in FIGS. 3-4. Therefore, the structure and description for the various features of the packaged acoustic wave component 200 in FIGS. 3-4 are understood to also apply to the corresponding features of the packaged acoustic wave component 200' in FIGS. 5-6, except as described below.

The packaged acoustic wave component 200' differs from the packaged acoustic wave component 200 in that the functional layer 214', 244' and the piezoelectric layer 212', 242' are not coextensive with (e.g., extends across a smaller area, extends along a shorter length) than the support layer 216', 246'. As shown in FIGS. 5-6, in one example the functional layer 214', 244' is coextensive with (e.g., extends across a same area as, extends along the same length as) the piezoelectric layer 212', 242'. Additionally, the frame 270' extends between (e.g., is in thermal communication with, in thermal contact with, in direct contact with) and interconnects the first and second acoustic wave devices 210', 240' (e.g., interconnects the support layer or substrate 216', 246' of the first and second acoustic wave devices 210', 240'). In one example, a gap G is defined between the frame 270' and the ends of the functional layer 214', 244' and the piezoelectric layer 212', 242' (e.g., to inhibit direct contact between the frame 270 and the functional layer 214', 244', and the piezoelectric layer 212', 242').

With reference to FIG. 6, heat generated by the IDT electrode 218' of the first acoustic wave resonator or device or die 210' is directed to the frame 270', as shown by arrows C1', to transfer said heat to the second acoustic wave resonator or device or die 240'. Such heat transfer to the frame 270' is facilitated by the high thermal conductivity of the support layer or substrate 216' of the first acoustic wave device 210'. Additionally, though not shown, heat from the first acoustic wave device 210' can also be transferred by the vias 222' to the second acoustic wave device 240'. Heat generated by the IDT electrode 248' of the second acoustic wave device 240' and heat received from the first acoustic wave device 210' (e.g., via the frame 270'), shown by arrows C2', is dissipated from the second acoustic wave device 240' by the vias 254', which transfer said heat to the electrodes 256' and to the printed circuit board (PCB) on which the packaged acoustic wave component 200' is mounted.

Figure 7A:
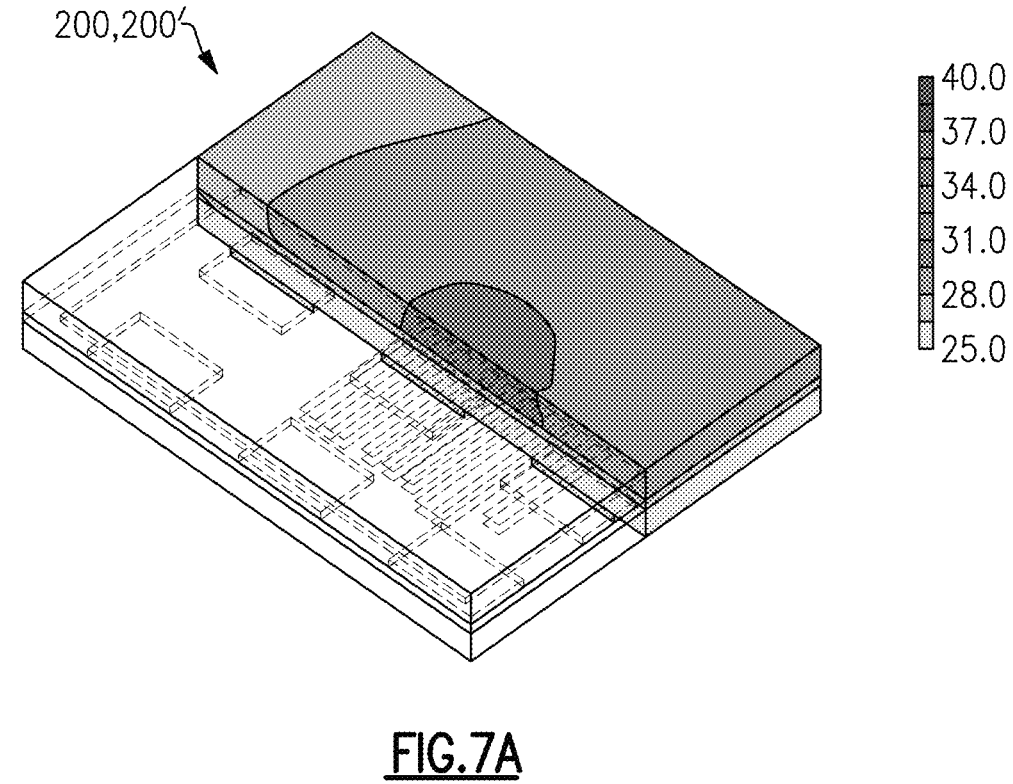
FIG. 7A illustrates a partial perspective view of a stacked MPS structure and thermal performance for same.
Figure 7B:
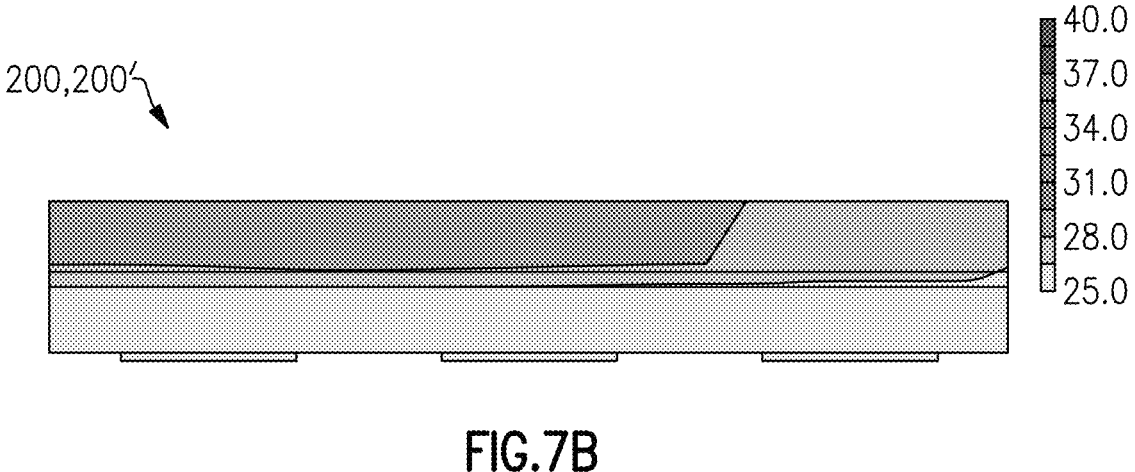
FIG. 7B illustrates a cross-sectional side view of the stacked MPS structure of FIG. 7A and thermal performance for same.

FIGS. 7A-7B show illustrations of thermal testing of the packaged surface acoustic wave component 200, which show that the temperature of the first acoustic wave device 210 of the packaged acoustic wave component 200 does not exceed 40 degrees Celsius during use. In some examples, the first (top) acoustic wave device 210 of the packaged acoustic wave component 200 achieves an top average temperature of approximately 30 degrees Celsius. Accordingly, the packaged acoustic wave component 200 advantageously remains under 100 degrees Celsius during use, allowing the packaged acoustic wave component 200 to avoid cracks or breaks in the first acoustic wave device 210.

Advantageously, the MPS structure of the packaged acoustic wave component 200, 200' allows for the reduction in temperature of the first acoustic wave device 210, 210' during operation, thereby reducing the mechanical stress they first (or top) acoustic wave device 210, 210' is subjected to and avoid cracks or breaks therein, resulting in improved mechanical ruggedness of the acoustic wave devices and MPS structure. Such temperature performance advantageously allows use of the first acoustic wave resonator or device 210, 210' for high power applications (e.g., in a high power transmit filter), while allowing for a size reduction in the packaged acoustic wave component 200, 200'. Additionally, the improved thermal performance (e.g., improved heat dissipation) of the packaged acoustic wave component 200, 200' due to the improved thermal performance of the first (or top) acoustic wave device 210, 210' allows for a reduction in the die area because filters can be arranged closer together.

The packaged acoustic wave component 200, 200' can be formed by forming or providing the second acoustic wave device 240, 240', forming or providing and bonding the frame 270, 270' and vias 222, 222' to the second acoustic wave device 240, 240', forming or providing the first acoustic wave device 210, 210' and boding the first acoustic wave device 210, 210' to the frame 270, 270' and vias 222, 222'.

The first acoustic wave device 210, 210' can optionally be formed by forming or providing the support layer or substrate 216, 216', forming or providing and bonding the functional layer 214, 214' onto the support layer or substrate 216, 216', forming or providing and bonding the piezoelectric layer 212, 212' onto the functional layer 214, 214', and forming or providing and bonding the IDT electrode 218, 218' onto the piezoelectric layer 212, 212'. The second acoustic wave device 240, 240' can optionally be formed by forming or providing the support layer or substrate 246, 246', forming or providing and bonding the functional layer 244, 244' onto the support layer or substrate 246, 246', forming or providing and bonding the piezoelectric layer 242, 242' onto the functional layer 244, 244', forming the vias 254, 254' through the piezoelectric layer 242, 242', the functional layer 244, 244', and the support layer 246, 246', forming or providing electrodes 256, 256' and connecting them to the vias 254, 254', and forming or providing and bonding the IDT electrode 248, 248' onto the piezoelectric layer 242, 242'.

The manufacturing process includes bonding the frame 270, 270' to the first acoustic wave device 210, 210' and second acoustic wave device 240, 240'. In one implementation, prior to bonding the frame 270, 270' to the first acoustic wave device 210, 210' and second acoustic wave device 240, 240', a portion of the piezoelectric layers 212, 212', 242, 242' and/or a portion of the functional layers 214, 214', 244, 244' are removed so that the frame 270, 270' can interconnect (e.g., contact) with the support layers 216, 216', 246, 246'. In one implementation, such portions can be removed after the IDT electrodes 218, 218', 248, 248' are formed or provided over the piezoelectric layers 212, 212', 242, 242'. In one example, such portions of the piezoelectric layers 212, 212', 242, 242' and/or the functional layers 214, 214', 244, 244' can be removed via an etching process.

An MPS acoustic wave resonator or device or die in a packaged acoustic wave component, including any suitable combination of features disclosed herein, can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS acoustic wave resonators disclosed herein. FR1 can be from 410 MHz to 7.125 GHz, for example, as specified in a current 5G NR specification. In 5G applications, the thermal dissipation of the MPS acoustic wave resonators disclosed herein can be advantageous. For example, such thermal dissipation can be desirable in 5G applications with a higher time-division duplexing (TDD) duty cycle compared to fourth generation (4G) Long Term Evolution (LTE). One or more MPS acoustic wave resonators in accordance with any suitable principles and advantages disclosed herein can be included in a filter arranged to filter a radio frequency signal in a 4G LTE operating band and/or in a filter having a passband that includes a 4G LTE operating band and a 5G NR operating band.

Figures 8A, 8B:
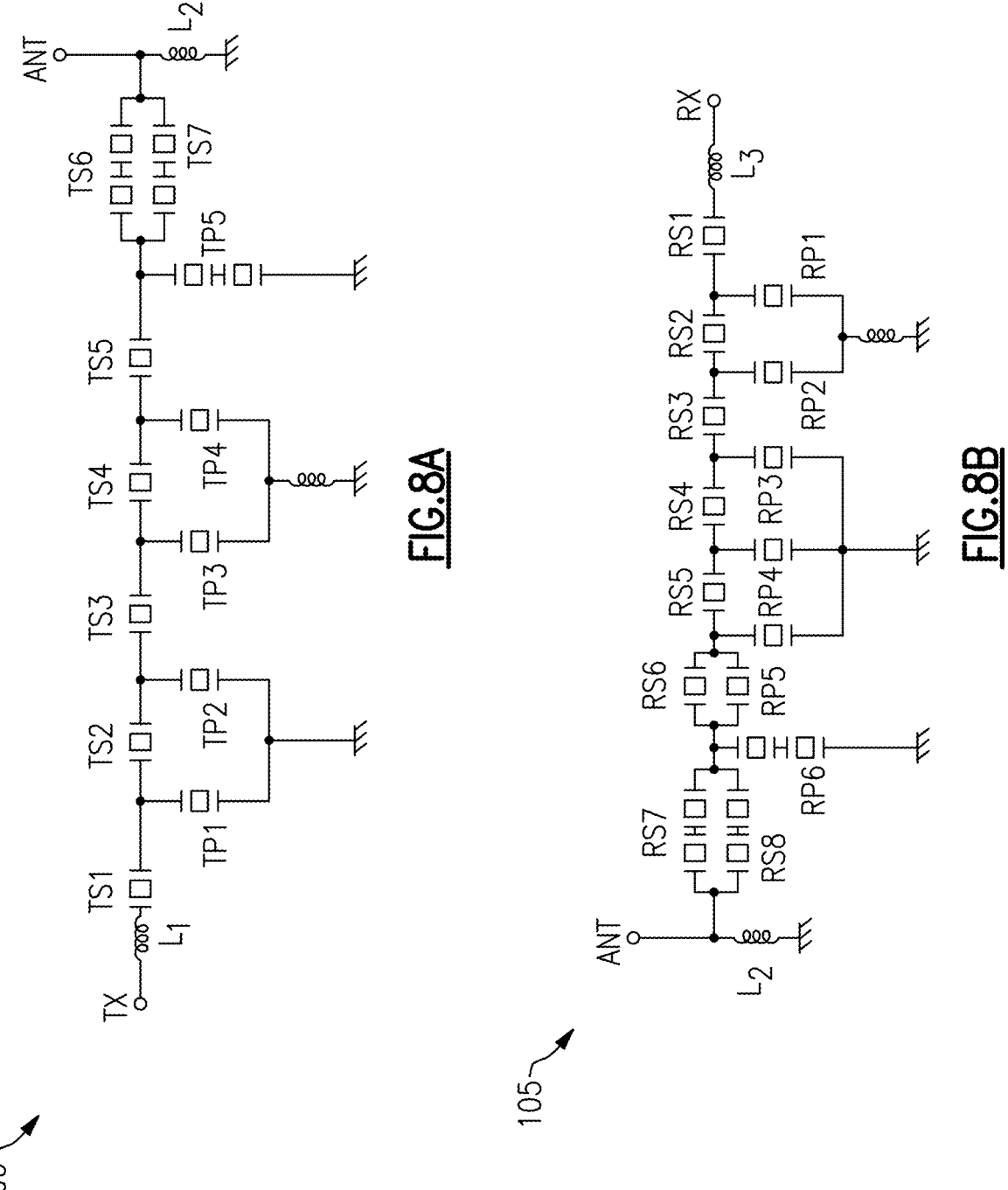
FIG. 8A is a schematic diagram of a transmit filter that includes a surface acoustic wave resonator according to an embodiment.
FIG. 8B is a schematic diagram of a receive filter that includes a surface acoustic wave resonator according to an embodiment.

FIG. 8A is a schematic diagram of an example transmit filter 100 that includes surface acoustic wave resonators according to an embodiment. The transmit filter 100 can be a band pass filter. The illustrated transmit filter 100 is arranged to filter a radio frequency signal received at a transmit port TX and provide a filtered output signal to an antenna port ANT. Some or all of the SAW resonators TS1 to TS7 and/or TP1 to TP5 can be a SAW resonator in accordance with any suitable principles and advantages disclosed herein. For instance, one or more of the SAW resonators of the transmit filter 100 can be an acoustic wave device 210, 210' of a packaged acoustic wave components 200, 200' of FIGS. 3-6. Alternatively or additionally, one or more of the SAW resonators of the transmit filter 100 can be any surface acoustic wave resonator disclosed herein. Any suitable number of series SAW resonators and shunt SAW resonators can be included in a transmit filter 100.

FIG. 8B is a schematic diagram of a receive filter 105 that includes surface acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the SAW resonators RS1 to RS8 and/or RP1 to RP6 can be SAW resonators in accordance with any suitable principles and advantages disclosed herein. For instance, one or more of the SAW resonators of the receive filter 105 can be an acoustic wave device 210, 210' of a packaged acoustic wave components 200, 200' of FIGS. 3-6. Alternatively or additionally, one or more of the SAW resonators of the receive filter 105 can be any surface acoustic wave resonator disclosed herein. Any suitable number of series SAW resonators and shunt SAW resonators can be included in a receive filter 105.

Although FIGS. 8A and 8B illustrate example ladder filter topologies, any suitable filter topology can include a SAW resonator in accordance with any suitable principles and advantages disclosed herein. Example filter topologies include ladder topology, a lattice topology, a hybrid ladder and lattice topology, a multi-mode SAW filter, a multi-mode SAW filter combined with one or more other SAW resonators, and the like.

Figure 9:
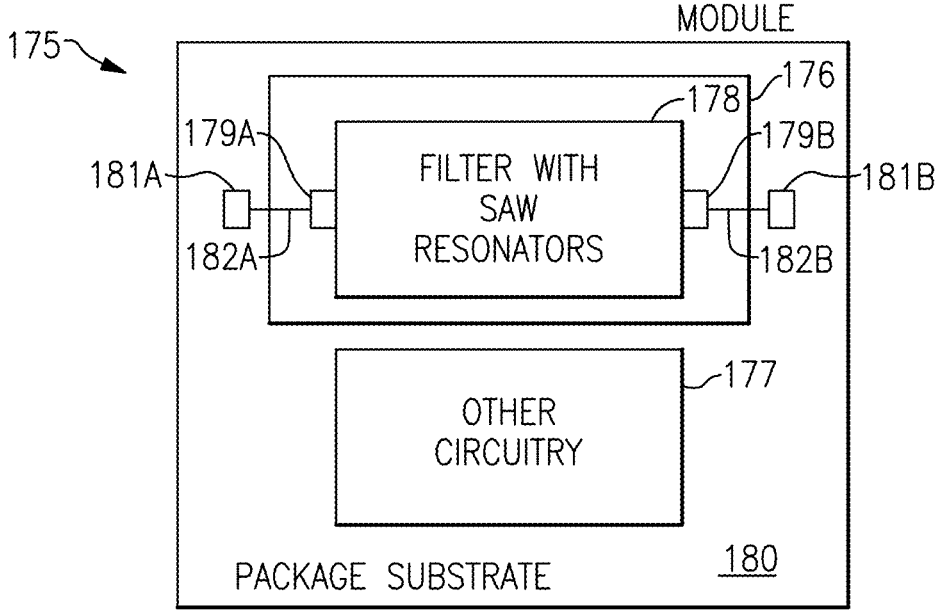
FIG. 9 is a schematic diagram of a radio frequency module that includes a surface acoustic wave resonator according to an embodiment.

FIG. 9 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators disclosed herein. The SAW component 176 can include a SAW die that includes SAW resonators.

The SAW component 176 shown in FIG. 9 includes a filter 178 and terminals 179A and 179B. The filter 178 includes SAW resonators. One or more of the SAW resonators can be implemented in accordance with any suitable principles and advantages of the acoustic wave devices 210, 210' of the packaged acoustic wave components 200, 200' of FIGS. 3-6 and/or any surface acoustic wave resonator disclosed herein. The terminals 179A and 178B can serve, for example, as an input contact and an output contact. The SAW component 176 and the other circuitry 177 are on a common packaging substrate 180 in FIG. 9. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 10:
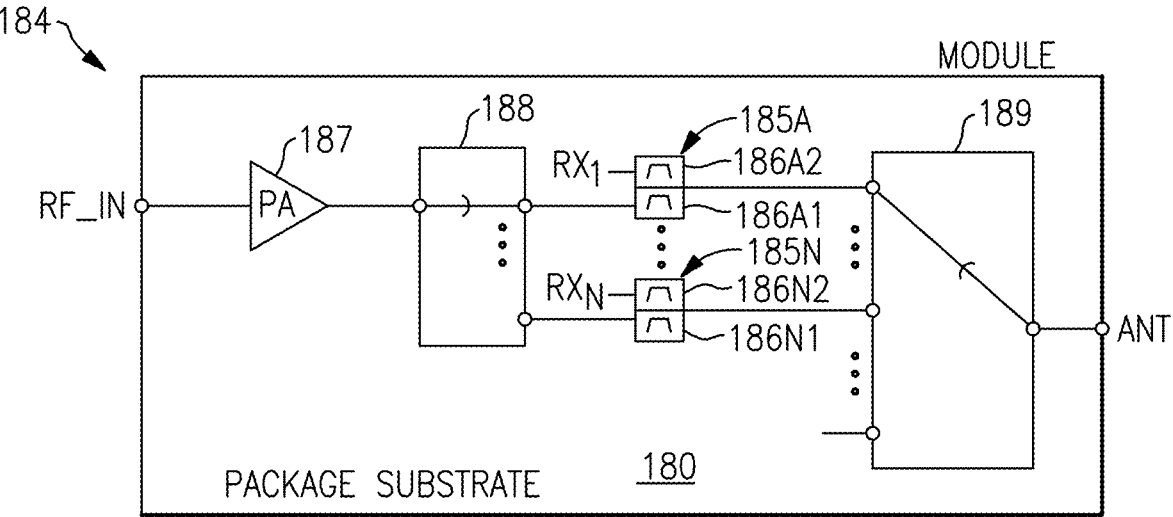
FIG. 10 is a schematic diagram of a radio frequency module that includes filters with surface acoustic wave resonators according to an embodiment.

FIG. 10 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators in accordance with any suitable principles and advantages disclosed herein. Similarly, one or more of the receive filters 186A2 to 186N2 can include one or more SAW resonators in accordance with any suitable principles and advantages disclosed herein. Although FIG. 10 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 11:
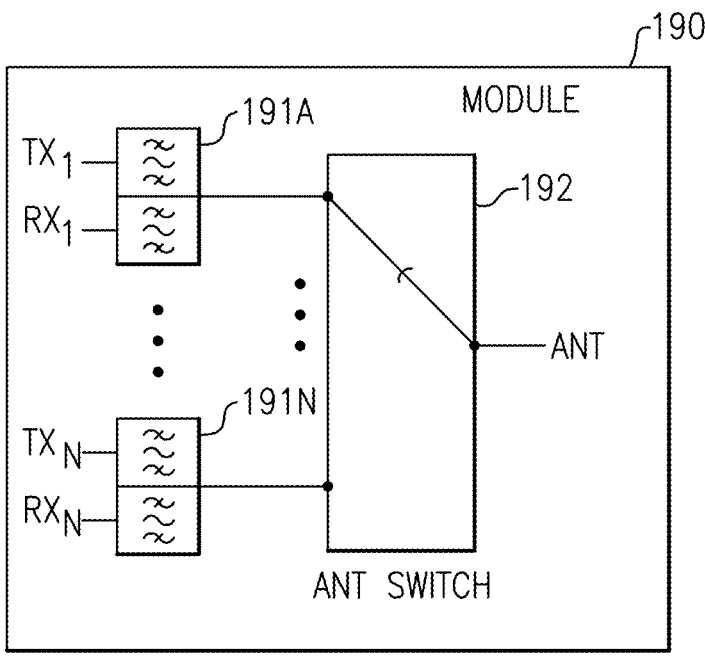
FIG. 11 is a schematic block diagram of a module that includes an antenna switch and duplexers that include a surface acoustic wave resonator according to an embodiment.

FIG. 11 is a schematic block diagram of a module 190 that includes duplexers 191A to 191N and an antenna switch 192. One or more filters of the duplexers 191A to 191N can include any suitable number of surface acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 12A:
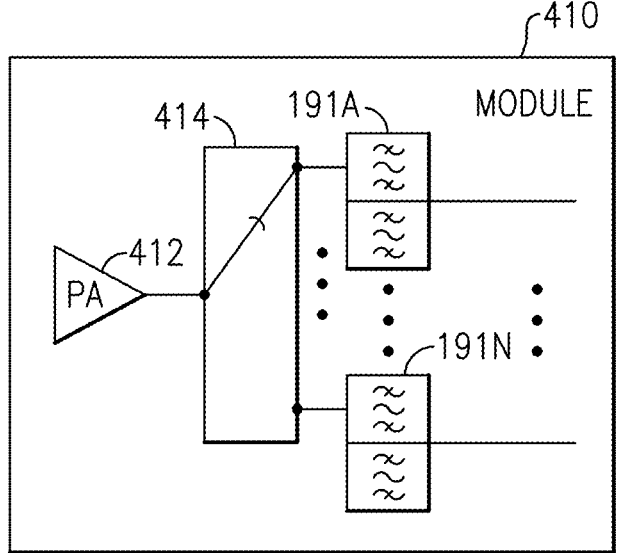
FIG. 12A is a schematic block diagram of a module that includes a power amplifier, a radio frequency switch, and duplexers that include a surface acoustic wave resonator according to an embodiment.

FIG. 12A is a schematic block diagram of a module 410 that includes a power amplifier 412, a radio frequency switch 414, and duplexers 191A to 191N in accordance with one or more embodiments. The power amplifier 412 can amplify a radio frequency signal. The radio frequency switch 414 can be a multi-throw radio frequency switch. The radio frequency switch 414 can electrically couple an output of the power amplifier 412 to a selected transmit filter of the duplexers 191A to 191N. One or more filters of the duplexers 191A to 191N can include any suitable number of surface acoustic wave resonators in accordance with any suitable principles and advantages discussed herein. Any suitable number of duplexers 191A to 191N can be implemented.

Figure 12B:
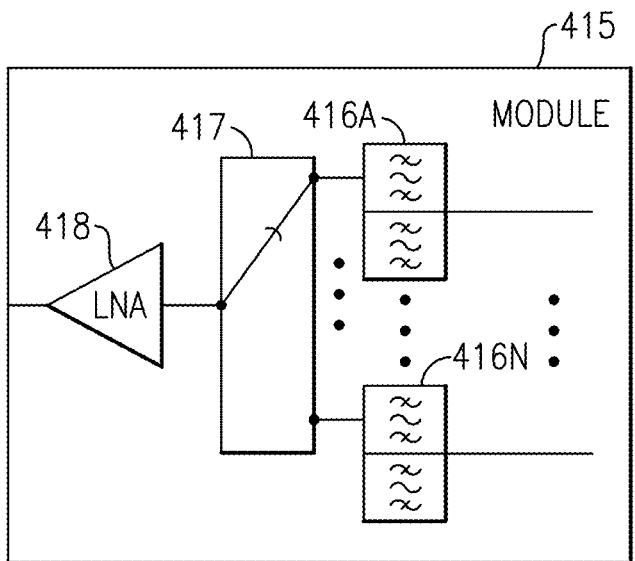
FIG. 12B is a schematic block diagram of a module that includes filters, a radio frequency switch, and a low noise amplifier according to an embodiment.

FIG. 12B is a schematic block diagram of a module 415 that includes filters 416A to 416N, a radio frequency switch 417, and a low noise amplifier 418 according to an embodiment. One or more filters of the filters 416A to 416N can include any suitable number of acoustic wave resonators in accordance with any suitable principles and advantages disclosed herein. Any suitable number of filters 416A to 416N can be implemented. The illustrated filters 416A to 416N are receive filters. In some embodiments (not illustrated), one or more of the filters 416A to 416N can be included in a multiplexer that also includes a transmit filter. The radio frequency switch 417 can be a multi-throw radio frequency switch. The radio frequency switch 417 can electrically couple an output of a selected filter of filters 416A to 416N to the low noise amplifier 418. In some embodiments (not illustrated), a plurality of low noise amplifiers can be implemented. The module 415 can include diversity receive features in certain applications.

Figure 13A:
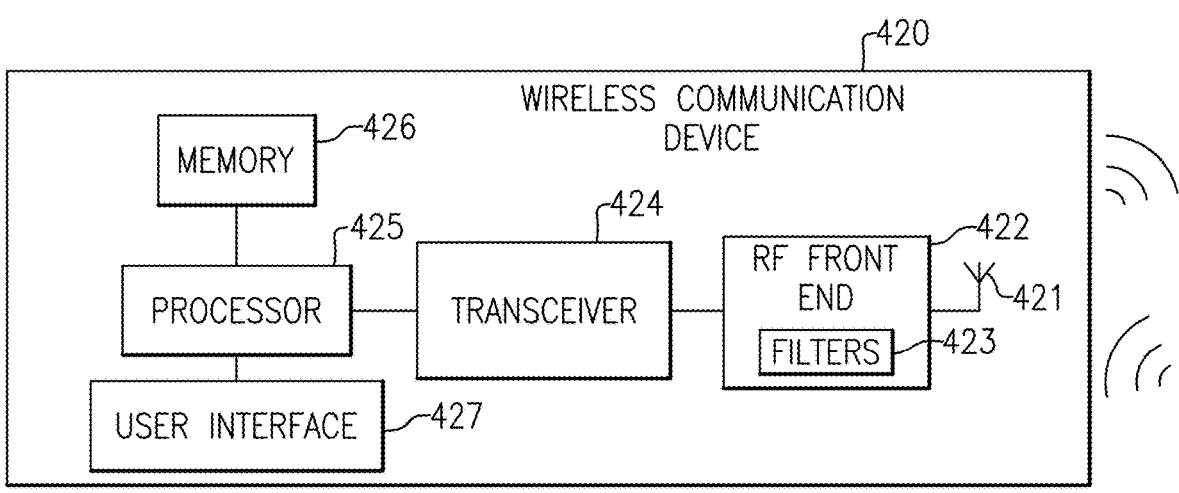
FIG. 13A is a schematic block diagram of a wireless communication device that includes a filter with a surface acoustic wave resonator in accordance with one or more embodiments.

FIG. 13A is a schematic diagram of a wireless communication device 420 that includes filters 423 in a radio frequency front end 422 according to an embodiment. The filters 423 can include one or more SAW resonators in accordance with any suitable principles and advantages discussed herein. The wireless communication device 420 can be any suitable wireless communication device. For instance, a wireless communication device 420 can be a mobile phone, such as a smart phone. As illustrated, the wireless communication device 420 includes an antenna 421, an RF front end 422, a transceiver 424, a processor 425, a memory 426, and a user interface 427. The antenna 421 can transmit/receive RF signals provided by the RF front end 422. Such RF signals can include carrier aggregation signals. Although not illustrated, the wireless communication device 420 can include a microphone and a speaker in certain applications.

The RF front end 422 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 422 can transmit and receive RF signals associated with any suitable communication standards. The filters 423 can include SAW resonators of a SAW component that includes any suitable combination of features discussed with reference to any embodiments discussed above.

The transceiver 424 can provide RF signals to the RF front end 422 for amplification and/or other processing. The transceiver 424 can also process an RF signal provided by a low noise amplifier of the RF front end 422. The transceiver 424 is in communication with the processor 425. The processor 425 can be a baseband processor. The processor 425 can provide any suitable base band processing functions for the wireless communication device 420. The memory 426 can be accessed by the processor 425. The memory 426 can store any suitable data for the wireless communication device 420. The user interface 427 can be any suitable user interface, such as a display with touch screen capabilities.

Figure 13B:
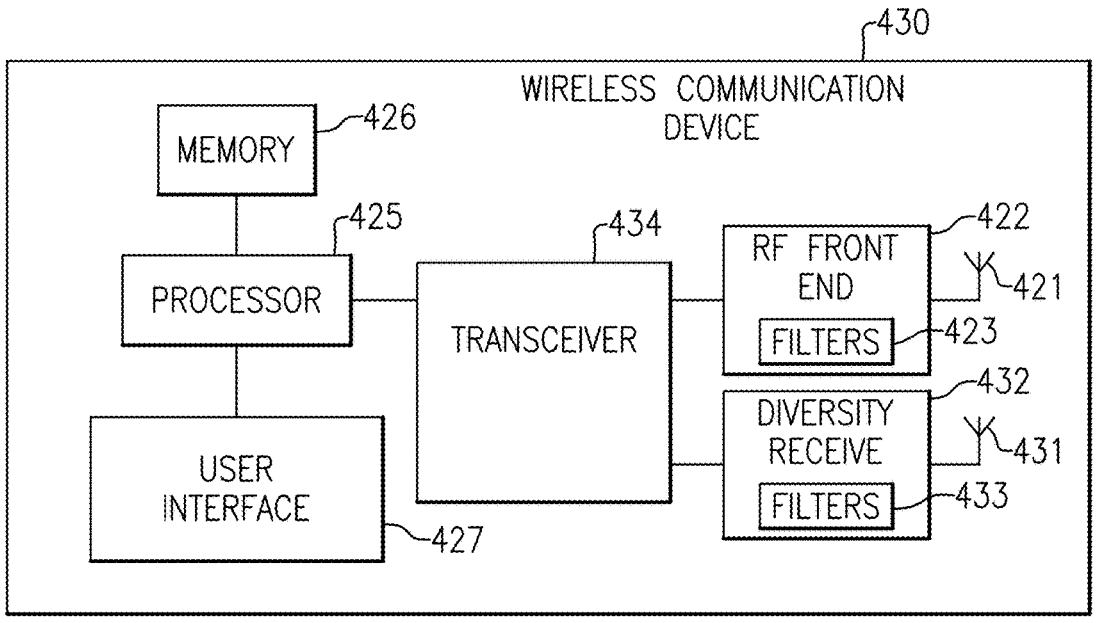
FIG. 13B is a schematic block diagram of another wireless communication device that includes a filter with a surface acoustic wave resonator in accordance with one or more embodiments.

FIG. 13B is a schematic diagram of a wireless communication device 430 that includes filters 423 in a radio frequency front end 422 and a second filter 433 in a diversity receive module 432. The wireless communication device 430 is like the wireless communication device 400 of FIG. 13A, except that the wireless communication device 430 also includes diversity receive features. As illustrated in FIG. 13B, the wireless communication device 430 includes a diversity antenna 431, a diversity module 432 configured to process signals received by the diversity antenna 431 and including filters 433, and a transceiver 434 in communication with both the radio frequency front end 422 and the diversity receive module 432. The filters 433 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators that include an IDT electrode, such as Lamb wave resonators and/or boundary wave resonators. For example, any suitable combination of features of the tilted and rotated IDT electrodes disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures.

Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged acoustic wave component comprising:
a first acoustic wave device including a first multi-layer piezoelectric substrate and a first interdigital transducer electrode, the first multi-layer piezoelectric substrate including a first piezoelectric layer and support layer, the support layer having a higher thermal conductivity than the first piezoelectric layer;
a second acoustic wave device including a second piezoelectric layer and second interdigital transducer electrode, the first acoustic wave device stacked with the second acoustic wave device so that the first and second interdigital transducer electrodes face and are spaced apart from each other; and a thermally conductive frame interposed vertically between and interconnecting the first and second acoustic wave devices, the thermally conductive frame extending along a periphery of the first and second acoustic wave devices, the first multi-layer piezoelectric substrate being configured to direct heat generated by the first acoustic wave device to the second acoustic wave device by way of the thermally conductive frame to dissipate heat from the first acoustic wave device.

2. The packaged acoustic wave component of claim 1 further comprising a first functional layer interposed between the first support layer and the first piezoelectric layer.

3. The packaged acoustic wave component of claim 1 wherein the second acoustic wave device includes a second multi-layer piezoelectric substrate including the second piezoelectric layer disposed over a second support layer.

4. The packaged acoustic wave component of claim 3 further comprising a second functional layer interposed between the second support layer and the second piezoelectric layer.

5. The packaged acoustic wave component of claim 1 wherein the first support layer is made of a material chosen from a group consisting of silicon, aluminum nitride, sapphire and quartz.

6. The packaged acoustic wave component of claim 1 wherein the first support layer has a larger thickness than the first piezoelectric layer.

7. The packaged acoustic wave component of claim 1 wherein a temperature of the first acoustic wave device increases to no more than approximately 30 degrees Celsius during operation of the second acoustic wave device.

8. A radio frequency module comprising:
a package substrate;
a packaged acoustic wave component including a first acoustic wave device including a first multi-layer piezoelectric substrate including a first piezoelectric layer disposed over a first support layer and a first interdigital transducer electrode, a second acoustic wave device including a second piezoelectric layer and second interdigital transducer electrode, the first acoustic wave device stacked with the second acoustic wave device so that the first and second interdigital transducer electrodes face and are spaced apart from each other, and a thermally conductive frame interposed vertically between and interconnecting the first and second acoustic wave devices, the thermally conductive frame extending along a periphery of the first and second acoustic wave devices, the first multi-layer piezoelectric substrate being configured to direct heat generated by the first acoustic wave device to the second acoustic wave device by way of the thermally conductive frame to dissipate heat from the first acoustic wave device; and
additional circuitry, the packaged acoustic wave component and additional circuitry disposed on the package substrate.

9. The radio frequency module of claim 8 wherein the thermally conductive frame contacts the first support layer.

10. The radio frequency module of claim 8 further comprising a first functional layer interposed between the first support layer and the first piezoelectric layer.

11. The radio frequency module of claim 8 wherein the second acoustic wave device includes a second multi-layer piezoelectric substrate including the second piezoelectric layer disposed over a second support layer.

12. The radio frequency module of claim 11 further comprising a second functional layer interposed between the second support layer and the second piezoelectric layer.

13. The radio frequency module of claim 8 wherein the first support layer is made of a material chosen from a group consisting of silicon, aluminum nitride, sapphire and quartz.

14. The radio frequency module of claim 8 wherein the first support layer has a larger thickness than the first piezoelectric layer.

15. The radio frequency module of claim 8 wherein a temperature of the first acoustic wave device increases to no more than approximately 30 degrees Celsius during operation of the second acoustic wave device.

16. A wireless communication device comprising:
an antenna; and
a front end module including one or more packaged acoustic wave components configured to filter a radio frequency signal associated with the antenna, each surface packaged acoustic wave component including a first acoustic wave device including a first multi-layer piezoelectric substrate including a first piezoelectric layer disposed over a first support layer and a first interdigital transducer electrode, a second acoustic wave device including a second piezoelectric layer and second interdigital transducer electrode, the first acoustic wave device stacked with the second acoustic wave device so that the first and second interdigital transducer electrodes face and are spaced apart from each other, and a thermally conductive frame interposed vertically between and interconnecting the first and second acoustic wave devices, the thermally conductive frame extending along a periphery of the first and second acoustic wave devices, the first multi-layer piezoelectric substrate being configured to direct heat generated by the first acoustic wave device to the second acoustic wave device by way of the thermally conductive frame to dissipate heat from the first acoustic wave device.

17. The wireless communication device of claim 16 wherein the thermally conductive frame contacts the first support layer.

18. The wireless communication device of claim 16 further comprising a first functional layer interposed between the first support layer and the first piezoelectric layer.

19. The wireless communication device of claim 16 wherein the second acoustic wave device includes a second multi-layer piezoelectric substrate including the second piezoelectric layer disposed over a second support layer.

20. The wireless communication device of claim 19 further comprising a second functional layer interposed between the second support layer and the second piezoelectric layer.

21. The wireless communication device of claim 16 wherein the first support layer is made of a material chosen from a group consisting of silicon, aluminum nitride, sapphire and quartz.

22. The wireless communication device of claim 16 wherein the first support layer has a larger thickness than the first piezoelectric layer.

23. The wireless communication device of claim 16 wherein a temperature of the first acoustic wave device increases to no more than approximately 30 degrees Celsius during operation of the second acoustic wave device.

* * * * *